(12) United States Patent
Higuchi et al.

(10) Patent No.: US 9,914,295 B2
(45) Date of Patent: Mar. 13, 2018

(54) METHOD FOR MANUFACTURING STRUCTURE

(71) Applicant: CANON KABUSHIKI KAISHA, Tokyo (JP)

(72) Inventors: Hiroshi Higuchi, Atsugi (JP); Masataka Kato, Hiratsuka (JP); Yoshinao Ogata, Fukushima (JP); Toshiyasu Sakai, Kawasaki (JP); Takayuki Kamimura, Kawasaki (JP); Tetsushi Ishikawa, Tokyo (JP); Atsunori Terasaki, Kawasaki (JP); Masahiko Kubota, Tokyo (JP); Ryoji Kanri, Zushi (JP); Yoshiyuki Fukumoto, Kawasaki (JP); Yasuaki Tominaga, Kawasaki (JP); Tamaki Sato, Kawasaki (JP); Masafumi Morisue, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/059,084

(22) Filed: Mar. 2, 2016

(65) Prior Publication Data

US 2016/0260601 A1    Sep. 8, 2016

(30) Foreign Application Priority Data

Mar. 4, 2015  (JP) .................... 2015-042690

(51) Int. Cl.
*H01L 21/00* (2006.01)
*B41J 2/00* (2006.01)
(Continued)

(52) U.S. Cl.
CPC ............. *B41J 2/00* (2013.01); *B41J 2/1601* (2013.01); *B41J 2/1628* (2013.01); *B41J 2/1629* (2013.01); *B41J 2/1631* (2013.01); *B41J 2/14* (2013.01); *B41J 2/14072* (2013.01); *B41J 2/1643* (2013.01); *H01L 21/565* (2013.01);
(Continued)

(58) Field of Classification Search
CPC ........... H01L 24/0274; H01L 21/31116; H01L 21/30604; H01L 21/308; B41J 2/1601; B41J 2/1629
USPC ................... 438/21, 127, 694; 257/621, 618, 257/E21.001; 347/20, 29
See application file for complete search history.

(56) References Cited

U.S. PATENT DOCUMENTS 6,555,480 B2 * 4/2003 Milligan ............... B41J 2/1404
                                                    216/2
6,569,343 B1 * 5/2003 Suzuki .................. B41J 2/1433
                                                    216/2
(Continued)

FOREIGN PATENT DOCUMENTS

JP      2006227544 A     8/2006

*Primary Examiner* — Thinh T Nguyen
(74) *Attorney, Agent, or Firm* — Canon U.S.A., Inc. IP Division

(57) ABSTRACT

A method for manufacturing a structure having a substrate in which holes are formed and a photosensitive resin layer provided on the substrate in such a manner as to cover at least a part of the holes includes a process of preparing a substrate in which holes formed by a surface in which a wavelike shape is formed and a photosensitive resin layer provided on the substrate in such a manner as to cover at least a part of the holes and an exposure process of exposing the photosensitive resin layer on the substrate.

19 Claims, 14 Drawing Sheets

(51) Int. Cl.
    *B41J 2/14* (2006.01)
    *B41J 2/16* (2006.01)
    *H01L 21/56* (2006.01)
(52) U.S. Cl.
    CPC .............. *H01L 2924/01078* (2013.01); *H01L 2924/01079* (2013.01)

(56) References Cited

U.S. PATENT DOCUMENTS

| | | | | |
|---|---|---|---|---|
| 6,799,831 | B2* | 10/2004 | Inamoto | B41J 2/1404 347/44 |
| 8,061,809 | B2* | 11/2011 | Ikegame | B41J 2/1404 347/47 |
| 2009/0153620 | A1* | 6/2009 | Ikegame | B41J 2/14145 347/47 |
| 2014/0231542 | A1* | 8/2014 | Sato | B41J 2/1603 239/104 |

* cited by examiner

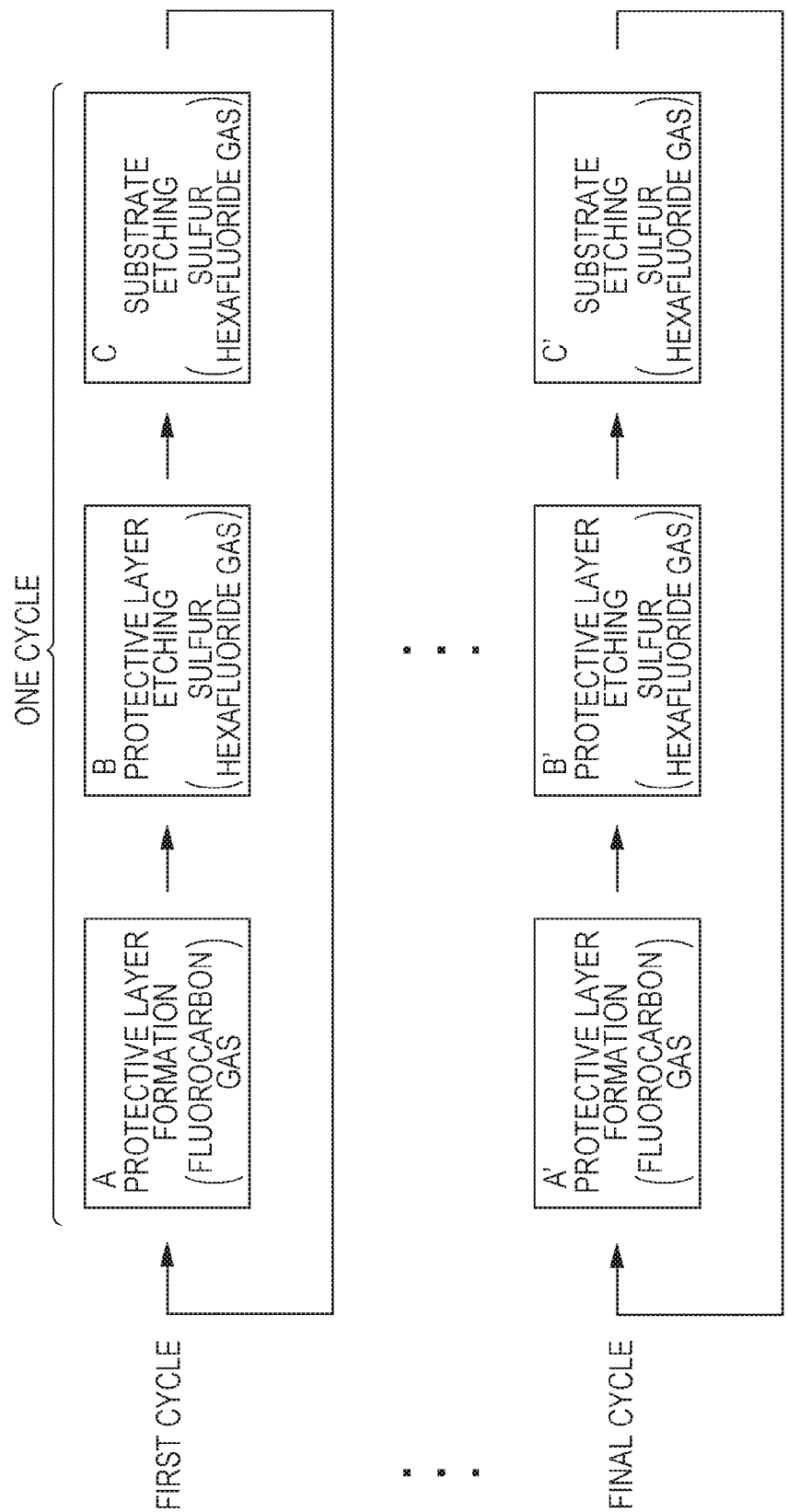

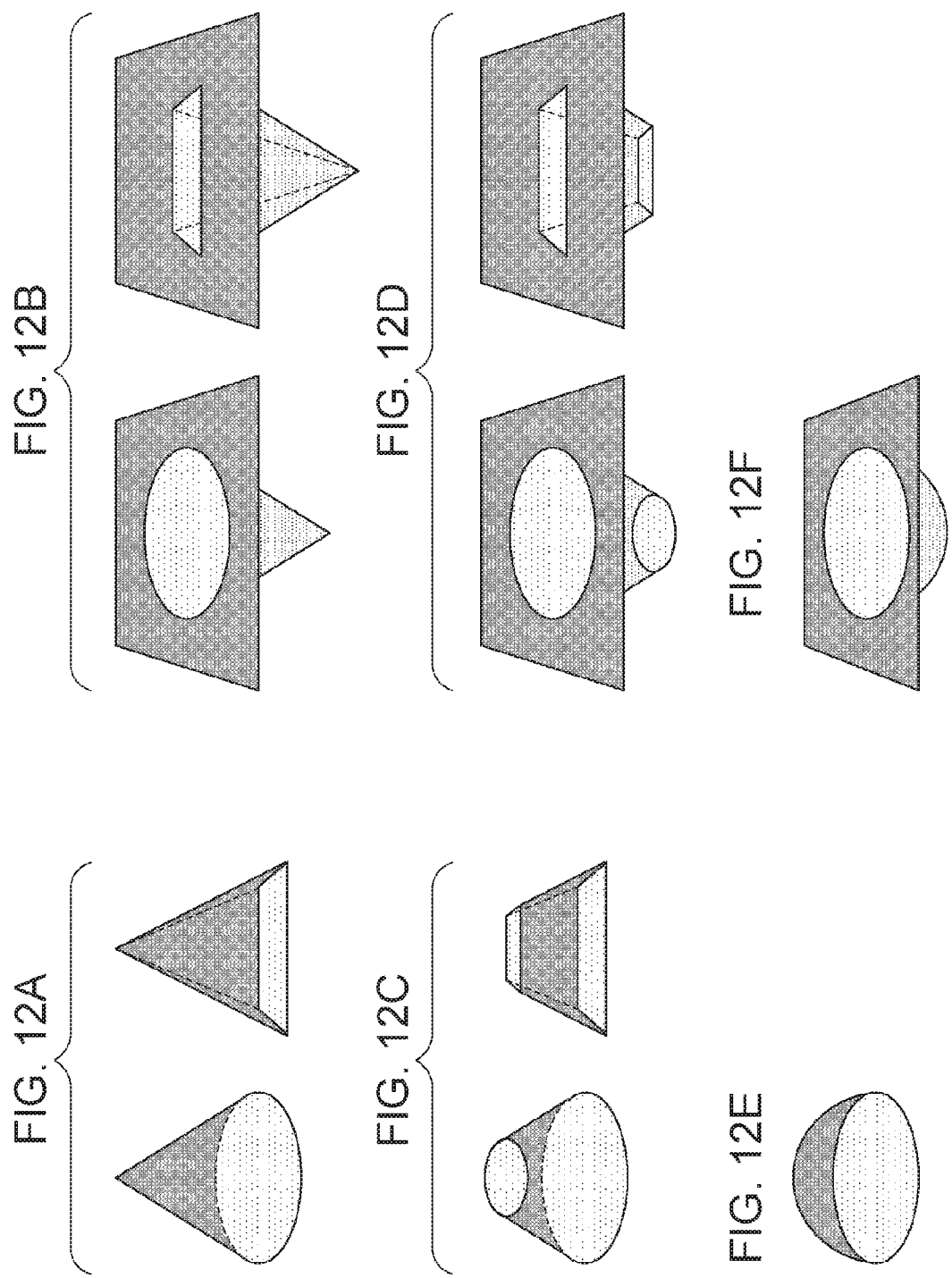

METHOD FOR MANUFACTURING STRUCTURE

BACKGROUND OF THE INVENTION

Field of the Invention

The present invention relates to a method for manufacturing a structure.

Description of the Related Art

In MEMS (Micro Electro Mechanical Systems) processing or some of various kinds of semiconductor device processing, a through hole and a non-through hole are formed in a substrate in some cases. For example, in a process of manufacturing a liquid ejection head typified by an inkjet head, a supply port which is a through hole is formed in a substrate formed with silicon or the like. On the substrate, structures, such as a channel forming member forming a channel and an ejection port forming member forming an ejection port, are disposed. The channel forming member also forms an ejection port in some cases. On the substrate, an energy-generating element generating energy for ejecting liquid is disposed, and the energy is given to liquid, whereby the liquid is elected from the election port.

With respect to a method for manufacturing such structures, such as a channel forming member and an ejection port forming member, Japanese Patent Laid-Open No. 2006-227541 describes a method including sticking a photosensitive resin layer onto a substrate having fine concave portions, and then exposing and developing the resultant substrate to thereby manufacture structures on the substrate. This method is implemented by so-called photolithography.

SUMMARY OF THE INVENTION

The present invention is a method for manufacturing a structure having a substrate in which holes are formed and a photosensitive resin layer provided on the substrate in such a manner as to cover at least a part of the holes, and the method includes a process of preparing a substrate in which holes formed by a surface in which a wavelike shape is formed and a photosensitve resin layer provided on the substrate in such a manner as to cover at least a part of the holes, and an exposure process of exposing the photosensitive resin layer on the substrate.

Further features of the present invention will become apparent from the following description of exemplary embodiments with reference to the attached drawings.

BRIEF DESCRIPTION OF THE DRAWINGS

FIG. 4 is a view illustrating a bosch process.

FIGS. 12A to 12F are views illustrating the wavelike shape.

DESCRIPTION OF THE EMBODIMENTS

Figure 5A:
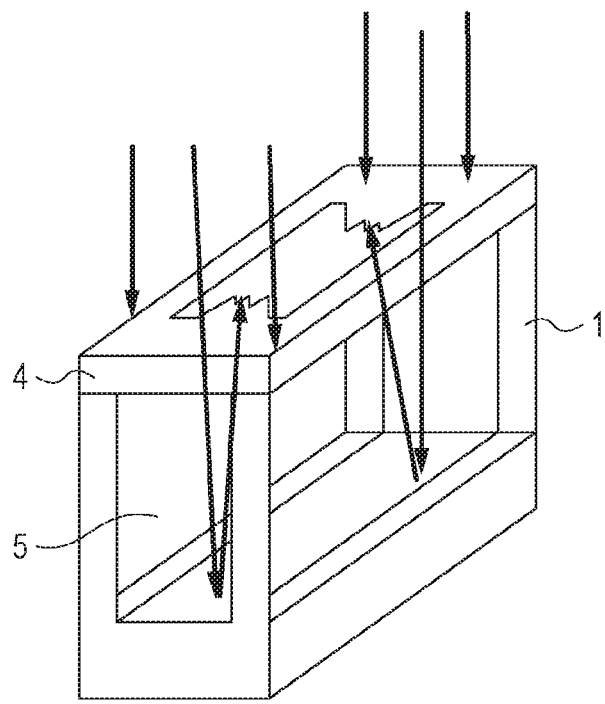
FIGS. 5A and 5B are views illustrating exposure of a photosensitive resin layer by reflected light.
Figure 5B:
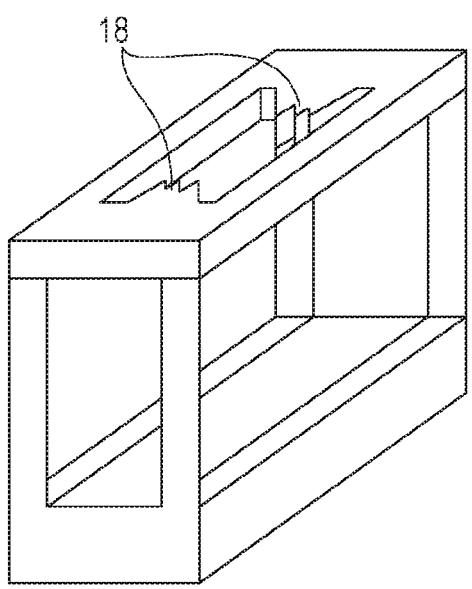

According to a method of Japanese Patent Laid-Open No. 2006-227544, a channel and an ejection port has not been formed into desired shapes depending on the substrate shape in some cases. As a result of examining the cause therefor, it has been found that, when a photosensitive resin layer is exposed, light is reflected from a space (concave portion) formed in the substrate, and then a region which is essentially not to be exposed of the photosensitive resin layer is exposed by the reflected light to cause shape changes. The states where such reflection has occurred are shown in FIGS. 5A and 5B. A space 5 is formed between a substrate 1 and a photosensitive resin layer 4. As illustrated in FIG. 5A, light is reflected from the bottom surface and the side surface of the space 5. As a result, as illustrated in FIG. 5B, an unintended region 18 is exposed, and then the exposed region is left also after development, so that a structure of a desired shape cannot be obtained.

Therefore, the present invention aims at forming a structure with high accuracy by photolithography on a substrate having concave portions.

A method for manufacturing a structure of the present invention is described with reference to FIGS. 1A to 1E.

Figure 1A:
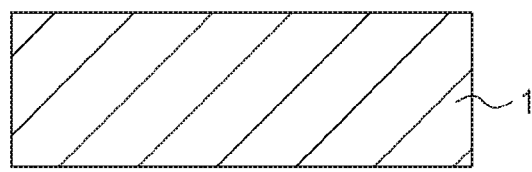
FIGS. 1A to 1E are views illustrating a method for manufacturing a structure.

First, a substrate 1 is prepared as illustrated in FIG. 1A. As the substrate 1, a silicon substrate formed with silicon is used, for example. The thickness of the substrate 1 is suitably 400 μm or more and 1000 μm or less.

Figure 1B:
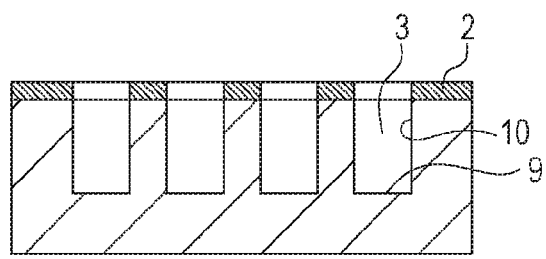

Next, as illustrated in FIG. 1B, a mask 2 is disposed on the substrate 1, and then holes (concave portions) 3 are formed in the substrate 1 using the mask 2. The mask 2 is formed by patterning a positive photosensitive resin or a negative photosensitive resin by photolithography, for example. The thickness of the mask 2 is suitably fpm or more and 20 μm or less. The formation of the concave portions 3 is carried out by dry etching, for example. As the dry etching, reactive ion etching using chlorine-based gas, fluorine-based gas, and the like is mentioned, for example. Particularly when it is demanded to form the concave portions 3 perpendicularly to the surface of the substrate 1, it is suitable to perform a bosch process including repeating one cycle, which includes film formation of a protective film, etching of the protective film, and etching of the substrate, two or more times. An example of the plurality of cycles is illustrated in FIG. 4. The bosch process is performed using sulfur hexafluoride and fluorocarbon, for example, and the film formation and the etching (formation) of the protective film and the etching of the substrate are alternately repeated in several seconds. Thus, the concave portion 3 formed by a bottom surface 9 and side surfaces 10 is formed.

Figure 1C:
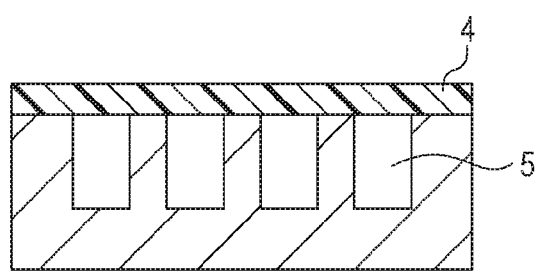

Next, as illustrated in FIG. 1C, a photosensitive resin layer 4 is formed on the substrate 1. The photosensitive resin layer 4 is suitably formed with a dry film. The photosensitive resin layer 4 may be a negative photosensitive resin layer or a positive photosensitive resin layer and is suitably a negative photosensitive resin layer. By covering the concave portions 3 with the photosensitive resin layer 4, the concave portions 3 serve as holes present between the substrate 1 and the photosensitive resin layer 4, in other words, spaces 5. The space 5 is a region surrounded with the substrate 1 and the photosensitive resin layer 4. The space 5 may be sealed or may partially communicate with the outside. The photosensitive resin layer 4 may be provided in such a manner as to cover at least a part of the holes (spaces) 5.

Figure 1D:
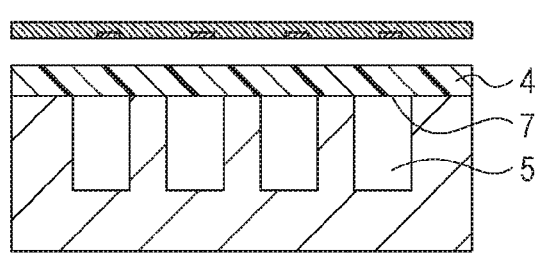

Next, as illustrated in FIG. 1D, the photosensitive resin layer 4 is exposed using a mask. The exposure is performed to a region including a surface 7 facing the space 5 of the photosensitive resin layer 4. Herein, an example in which a negative photosensitive resin is used as the photosensitive resin layer 4 is described, and a mask having openings with which portions to be finally left of the photosensitive resin layer are exposed is used.

Figure 1E:
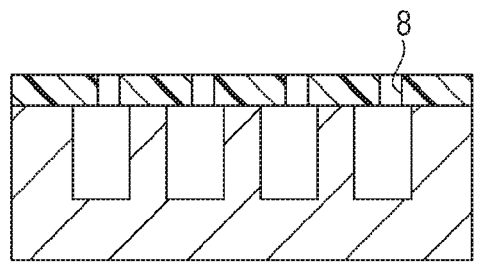

After the exposure, development is performed, and at least a part of the photosensitive resin layer 4 is removed, whereby, holes 8 are formed as illustrated in FIG. 1E. The development is performed with an alkaline solution or an organic solvent, such as and xylene. Thus, a structure having the holes 8 is manufactured on the substrate.

Herein, according to an examination of the present inventors, in the exposure performed in the process illustrated in FIG. 1D, reflected light has generated from the surface forming the holes (spaces) 5, and the photosensitive resin layer 4 has not been able to be patterned into a desired shape due to the effect of the reflected light, so that a desired structure has not been able to be manufactured in some cases. Then, in order to reduce the reflected light, when forming the concave portions 3 in the substrate 1 in the process illustrated in FIG. 1F, a wavelike shape is formed in the surface forming the concave portions 3, i.e., the surface forming the spaces 5. Due to the fact that the surface forming the spaces 5 has the wavelike shape, light transmitting through the photosensitive resin layer 4 is likely to cause diffused reflection in the space 5 in the exposure illustrated in FIG. 1D. As a result, the light entering the inside of the space 5 is absorbed and attenuated by the substrate 1, which makes it difficult for the light to return to the photosensitive resin layer 4 as reflected light. The surface in which the wavelike shape is formed among the surfaces forming the space 5 suitably includes a surface facing the photosensitive resin layer 4 of the space 5 and serving as the bottom of the space 5, i.e., a bottom surface 9. This is because the bottom surface 9 is one of surfaces which are considerably affected by reflection. Moreover, the surface in which the wavelike shape is to be formed also suitably includes a side surface 10 connecting two surfaces (one surface is the bottom surface 9) facing the photosensitive resin layer 4. This is because the wavelike shape of the side surface 10 also considerably affects the absorption of diffusely reflected light.

A method for forming the wavelike shape in the surface forming the concave portions is described in detail. When the surface forming the concave portions is used as the bottom surface, the wavelike shape can be formed by changing the etching conditions in the etching, for example. When the concave portions 3 are formed using the bosch process, the etching conditions in the final one cycle are strengthened. When a specific example is described, the flow rate of fluorocarbon to sulfur hexafluoride is increased in the protective film forming process in the final one cycle, for example. By increasing the supply amount of the fluorocarbon which is a protective gas for the etching surface, the film deposition on the etching bottom surface is increased, so that the etching of silicon by sulfur hexafluoride can be partially suppressed. Thus, the wavelike shape can be formed in the bottom surface 9. However, when the flow rate is excessively increased, the film deposition on the etching bottom surface excessively increases, so that a needlelike structure referred to as a black silicon is generated in some cases. Therefore, it is suitable to increase the flow by 5% to 25% based on the flow of the first cycle. In order to increase the film deposition, a method including changing the etching parameters (RF power, pressure, time) of the protective film forming process to adjust the etching parameters in such a manner as to increase the film deposition is mentioned in addition to the method including increasing the flow of the fluorocarbon. The methods described above relatively increase (strengthen) the film deposition but the etching conditions of the protective film in the protective film etching process may be mitigated. More specifically, the wavelike shape can be formed in the surface forming the concave portion also by reducing the flow of the sulfur hexafluoride or adjusting the other etching parameters in such a manner that the film deposition relatively increases.

Alternatively, by not etching the substrate in the final one cycle of the bosch process, the wavelike shape can also be formed in the bottom surface. In this case, since the etching of the substrate is hard to progress, the dimensional changes of the target depth (for example, 400 μm) hardly occur and the possibility that the black silicon is generated also becomes low. Therefore, the method is suitable as a method for efficiently forming the wavelike shape in the bottom surface. The processing time of the cycle of roughening the etching surface, particularly the bottom surface, is suitably set to 10 seconds or more and 600 seconds or less.

On the other hand, it is also effective to form the wavelike shape in the side surface of the space as described above. A case where the wavelike shape is formed in the side surface is described. For example, the bosch process includes anisotropic etching in which holes are deeply formed in the etching direction. Therefore, when forming the wavelike shape in the side wall which is a surface orthogonal to the etching direction, another concept different from the concept of the above-described method is needed. In the bosch process, the etching anisotropically progresses while protecting the side wall in the protective film forming process, and therefore the side surface is hard to be etched in the first place. Therefore, by strengthening the etching of the etching process having high isotropy among the processes of the bosch process, the progress of the etching of the side surface can be facilitated. Specifically, the time of the etching process is lengthened or the protective film forming process and the protective film etching process are omitted and only the etching process of the substrate is performed. In this case, in order to more efficiently form the wavelike shape, it is suitable to increase the generation amount of radicals by, for example, increasing the flow and the pressure of sulfur hexafluoride. Although the timing at which these processes are performed may be set in either the state where the protective film is present on the side surface or the state where the protective film is not present on the side surface, the wavelike shape can be efficiently formed when the processes are performed after removing the protective film on the side surface. As a method for removing the protective film, dry removal (oxygen ashing) and wet removal (chemical solution containing hydrofluoroether or hydroxylamine, for example) are mentioned, for example. Thus, the processing time of the cycle of forming the wavelike shape in the side surface is suitably set to 10 seconds or more and 600 seconds or less.

Although the concave portions 3, i.e., non-through holes, are formed in the substrate 1, and then the photosensitive resin layer 4 is disposed thereon to form spaces in FIG. 1, the holes to be formed in the substrate 1 may be through holes. An example in which through holes are formed in the substrate 1 is described with reference to FIGS. 2A to 2C.

Figure 2A:
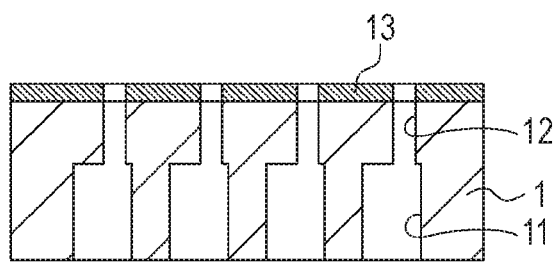
FIGS. 2A to 2C are views illustrating a method for manufacturing a structure.

First, holes 11 are formed in the substrate 1 as illustrated in FIG. 2A. The holes 11 may be formed in the same manners in the concave portions 3 of FIG. 1. Then, holes 12 are formed from the surface opposite to the surface in which the holes 11 are formed of the substrate 1. The holes 12 are formed using a mask 13 in the same manner as in the holes 11, for example. The holes 11 and the holes 12 communicate with each other as illustrated in FIG. 2A. More specifically, the through holes are formed in the substrate 1 by the holes 11 and the holes 12. A method for forming the through hole is not limited thereto and through holes may be formed only from one side surface of the substrate 1.

Figure 2B:
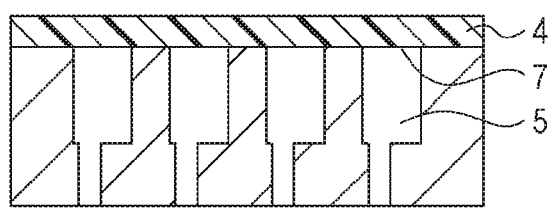

Next, as illustrated in FIG. 2B, a photosensitive resin layer 4 is formed on the substrate 1. By covering the through holes with the photosensitive resin layer 4, the through holes serve as spaces 5. The space 5 is present in a region surrounded with the substrate 1 and the photosensitive resin layer 4.

Figure 2C:
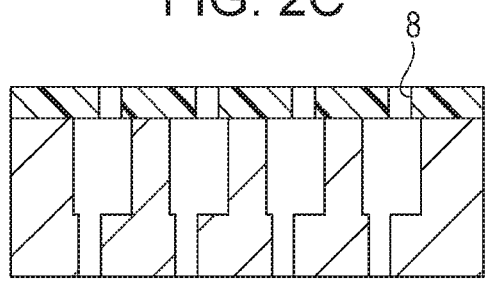

Thereafter, a region including a surface 7 facing the space 5 of the photosensitive resin layer 4 is exposed. After the exposure, development is performed, and then at least a part (for example, a non-exposed portion) of the photosensitive resin layer 4 is removed, whereby holes 8 are formed as illustrated in FIG. 2C. In the case of a liquid ejection head, the hole 8 serves as a channel for liquid. Thus, a structure is manufactured on the substrate 1.

Also when the spaces 5 penetrate the substrate 1 as illustrated in FIGS. 2A to 2C, reflected light from the spaces 5 generates in the exposure for forming the holes 8. Then, in the formation of the holes 11 and the holes 12, the wavelike shape is formed in the surface in which the holes 11 and the holes 12 are to be formed as described with reference to FIGS. 1A to 1E. The wavelike shape may be formed only in the surface in which the holes 11 are to be formed or may be formed only in the surface in which the holes 12 are to be formed. Alternatively, the wavelike shape may be formed in the surface in which both the holes are to be formed.

An example in which the method for manufacturing the structure described with reference to FIGS. 2A to 2C is applied to a method for manufacturing a liquid ejection head is described with reference to FIGS. 3A to 3G.

Figure 3A:
FIGS. 3A to 3G are views illustrating a method for manufacturing a liquid ejection head.

First, as illustrated in FIG. 3A, a substrate 1 having energy-generating elements 14 is prepared. As the energy-generating element 14, a heat generating element and a piezoelectric body are mentioned.

Figure 3E:
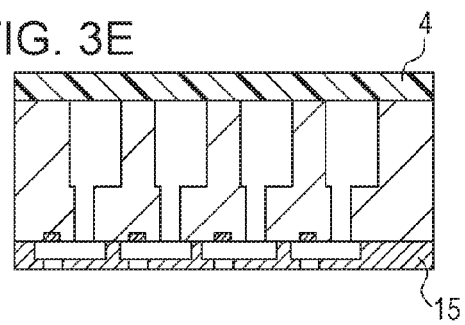
Figure 3B:
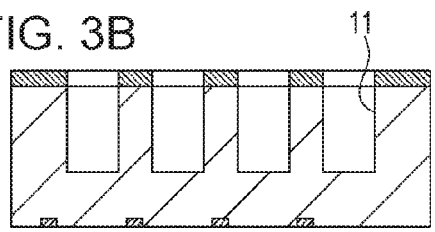
Figure 3F:
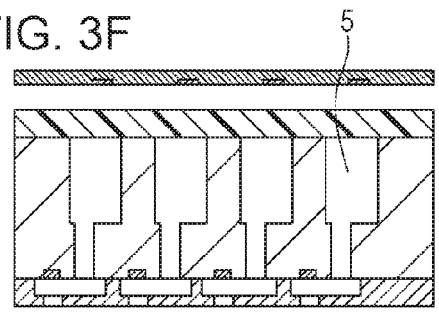
Figure 3C:
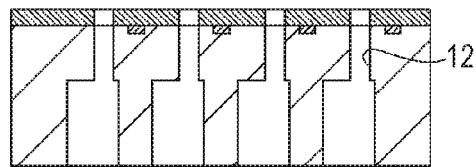

Then, as illustrated in FIG. 3B, holes 11 are formed from the surface opposite to the surface in which the energy-generating elements 14 are formed of the substrate 1. Then, holes 12 are formed from the surface in which the energy-generating element 14 are formed of the substrate 1 as illustrated in FIG. 3C. When forming the holes 12, it is suitable to form an etching stop layer on the surface opposite to the surface in which the energy-generating elements 14 are formed of the substrate 1. The etching stop layer is formed with an organic material, a ceramic plate, a glass substrate, or the like and supports the substrate 1 when forming the holes 12. Herein, as described with reference to FIGS. 1A to 1E, a wavelike shape is formed in a surface in which at least either the hole 11 or the hole 12 is to be formed depending on the etching conditions and the like. The hole 12 is made to communicate with the hole 11.

Figure 3G:
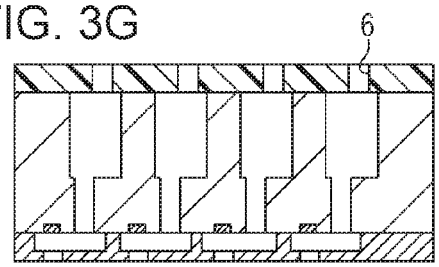
Figure 3D:
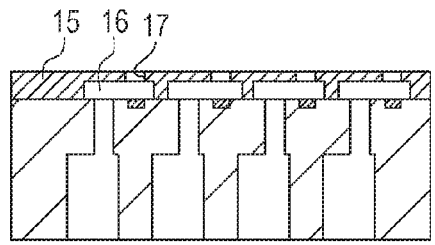

Thereafter, a channel forming member 15 is formed on the substrate 1 as illustrated in FIG. 3D. The channel forming member 15 forms a channel 16 and an ejection port 17.

Then, as illustrated, in FIG. 3E, a photosensitive resin layer 4 is formed on the surface opposite to the surface on which the channel forming member 15 is formed of the substrate 1. Then, exposure is performed using a mask as illustrated in FIG. 3F to form channels 6 as illustrated in FIG. 3G. The channel 6 communicates with the space 5 (first supply port) and the hole 22 (second supply port). The hole 12 communicates with the channel of the channel forming member 15.

By forming a wavelike shape in the surface forming the spaces 5 in advance in the formation of the channels 6, it can be suppressed that reflected light reflects on the photosensitive resin layer 4 to affect the pattern shape. When the channel forming member 25 to be formed in the process illustrated in FIG. 3D is formed by patterning the photosensitive resin layer by photolithography, it can be suppressed that reflected light generates in the photolithography due to the wavelike shape formed in the surface forming the holes 11 and the holes 12. In this case, the channel forming member 15 can be regarded as the structure of the present invention. The wavelike shape is formed by the method as described above.

When a liquid ejection head is manufactured by the method of the present invention, the wavelike shape is formed in the side surface of the holes (supply ports) in the substrate 1. Thus, the contact area of the substrate 1 and liquid increases, and therefore the temperature of the liquid whose temperature is increased by the energy-generating elements and the like can be lowered. Particularly when the temperature varies in a liquid ejection head, the heat dissipation properties of the entire liquid ejection head can be uniformized due to the wavelike shape formed in the wall of the supply port, so that liquid ejection can be uniformized. When the wavelike shape is a shape of a submicron order, the portion becomes hydrophilic, and, by promoting the flow of liquid, the occurrence of holding of air bubbles can also be suppressed.

The surface in which the wavelike shape is formed among the surfaces forming the space in order to suppress the generation of reflected light, the arithmetic average roughness at a reference length of 50 μm is suitably 0.02 μm or more and 0.50 μm or less. When the roughness is excessively low, the generation of reflected light becomes difficult to suppress. On the other hand, when roughness is excessively high, the black silicon is generated in some cases.

Figure 6:
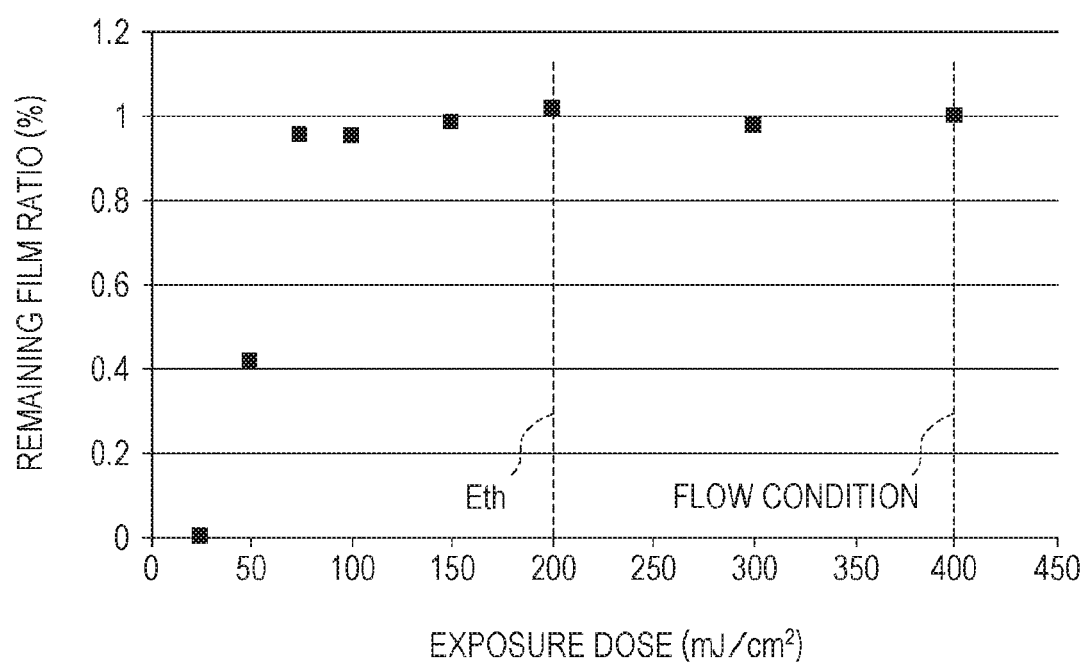
FIG. 6 is a view showing the relationship between an exposure dose and a remaining film of a photosensitive resin layer.

From a still another viewpoint, the conditions of suppressing the modification of the photosensitive resin layer due to reflected light are examined. Herein, a specific numerical value relationship is shown taking the case where TMMF (manufactured by TOKYO OHKA KOGYO) which is a negative photosensitive resin layer is used as the photosensitive resin layer as an example. FIG. 6 is the graph showing the relationship between the exposure dose and the remaining film ratio when the TMMF is exposed by UX4258 (manufactured by USHIO INC., Exposure wavelength of 365 nm). In the negative photosensitive resin layer, the exposed portion is cured and left, and therefore the exposure dose (Eth) at which the remaining film ratio is 100% serves as the minimum exposure dose. In this example, the Eth is set to 200 mJ/cm² and the flow condition is set to 400 mJ/cm² taking a margin twice as large as the Eth. On the other hand, the exposure dose in a region which can be regarded to be almost the same as a non-exposed portion is 50 mJ/cm² or less. Then, in a period from 50 mJ/cm² to 200 mJ/cm², the negative photosensitive resin layer enters a transitional state until sufficient reaction occurs. The negative photosensitive resin layer is gelled in exposure and is partially left as a structure after development in some cases. More specifically, the intensity of light reflected from the space is suitably suppressed theoretically to 50 mJ/cm² or less. In the case of a general negative photosensitive resin layer, the relative ratio of the above-described numerical relationship hardly greatly varies. Therefore, the numerical values required for preventing the reflection can be estimated based on this example.

The light for the exposure does not need to be ideally parallel light and basically has a certain degree of angular distribution. For example, in the case of an exposure machine employing a projection lens, a relationship NA=sin θ (Expression 1) is established between the numerical aperture NA and the angular vibration θ.

Figure 7:
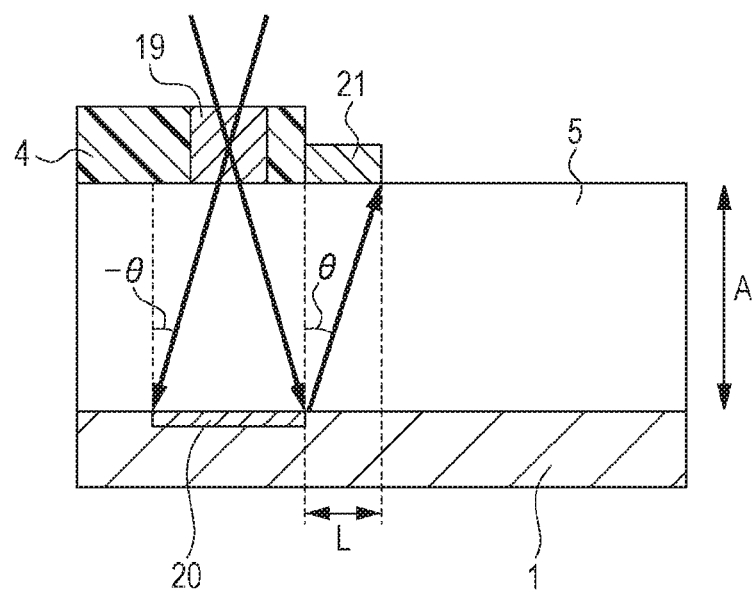
FIG. 7 is a view illustrating exposure of a photosensitive resin layer by reflected light.

When a simple system considering only a primary reflected light reflecting on the bottom surface of a structure is assumed in which the depth of the structure is defined as A and the distance of a region where the reflected light returns in terms of the mask dimension is defined as L as illustrated in FIG. 7, the relationship of L=A×tan θ(Expression 2) is obtained.

This is the mechanism in which the exposed region by the reflected light is generated. From Expression 2, the region becomes larger when the depth of the space 5 becomes larger.

As illustrated in FIG. 7, the exposed lights focus in the region 19 spread to the region 20 on the substrate surface. Among the lights, light reflecting toward a portion 21 which is basically not exposed is light only in a plus direction of θ specified by Expression 2. More specifically, the relative intensity R of the reflected light to incident light is expressed by R=r×(½)×T (Expression 3).

In Expression 3, r represents an absolute reflectivity (%) of the substrate surface and T represents the transmittance to the photosensitive resin.

When the substrate is a silicon substrate, the reflectivity r of a 365 nm light is about 60%. The transmittance T of the 365 nm light of TMMF is about 90%. When the values are substituted, R=about 27% is given. More specifically, the exposure dose of the reflected light to the incident light of 400 mJ/cm² is about 108 mJ/=².

Figure 8:
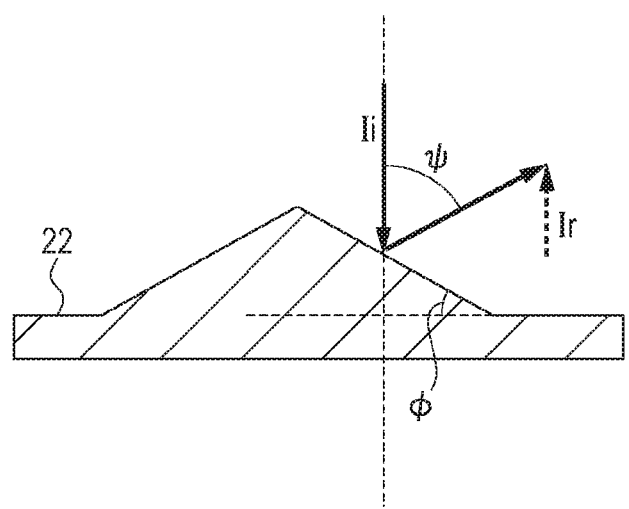
FIG. 8 is a view illustrating a wavelike shape.

Herein, it is considered to reduce the reflected light by the wavelike shape formed in the bottom surface of the space (Reflection suppression effect). First, as illustrated in FIG. 8, the reflection suppression effect is considered in connection with the side wall angle of the structure. The angle formed by a bottom surface 22 and the side wall of the wavelike shape of the space 5 formed in the substrate 1 is defined as φ and the angle formed by the incident light and the reflected light is defined as Ψ. When the intensity of light immediately before hitting the wavelike shape is defined as Ii, the intensity of the normal line component to the photosensitive resin layer of the reflected light scattered by the wavelike shape is defined as Ir, and Ir/Ii is defined as Rs, Rs is expressed by Expression 4.

$$Rs = Ir/Ii = r \times (½) \times \cos \psi = r \times (½) \times \cos 2\phi \quad \text{(Expression 4)}$$

Figure 9:
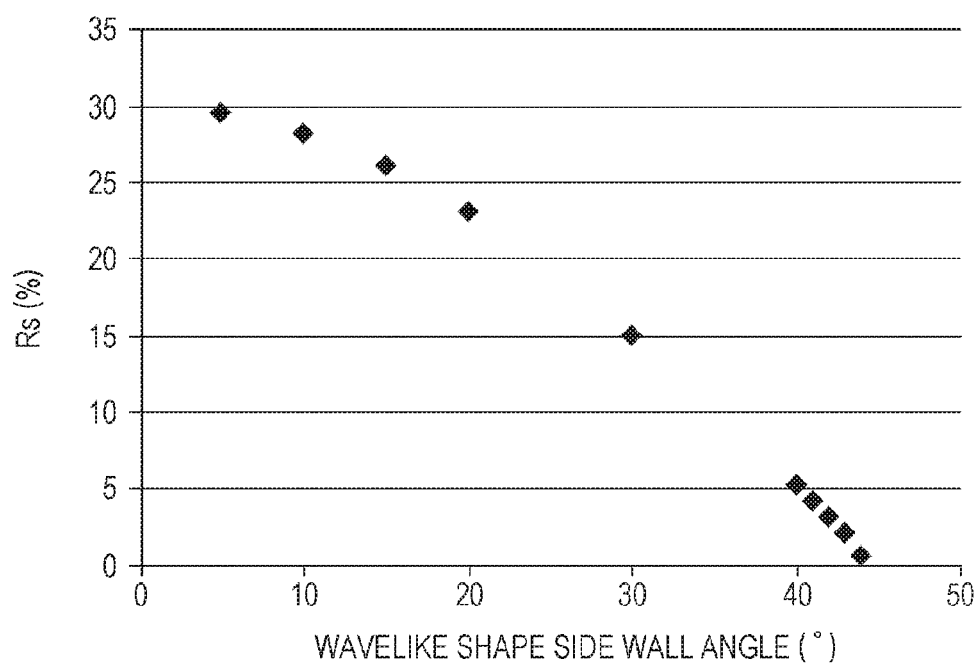
FIG. 9 is a view illustrating the relationship between the side wall angle of the wavelike shape and Rs.

Rs can be considered to be the reflectivity due to the wavelike shape. Expression 4 shows that the incident light does not return to the photosensitive resin layer in the case where φ is larger than or equal to 45°. The relationship between the wall side angle φ of the wavelike shape and Rs when 60% which is the reflectivity of the 365 nm light on the silicon substrate surface is substituted into r is as shown in FIG. 9.

Next, the relationship between the area ratio in which the wavelike shape occupies the bottom surface of the space and the intensity of the reflected light is shown in Expression 5. When the area ratio in which the wavelike shape occupies the substrate bottom surface is defined as X (%), the exposure dose of the incident light is defined as Ei (mJ/cm²), and the intensity of the reflected light in that case is defined as Er (mJ/cm²), Er=(1−X(1−cos 2φ))×Ei×R (Expression 5) is established.

Figure 10:
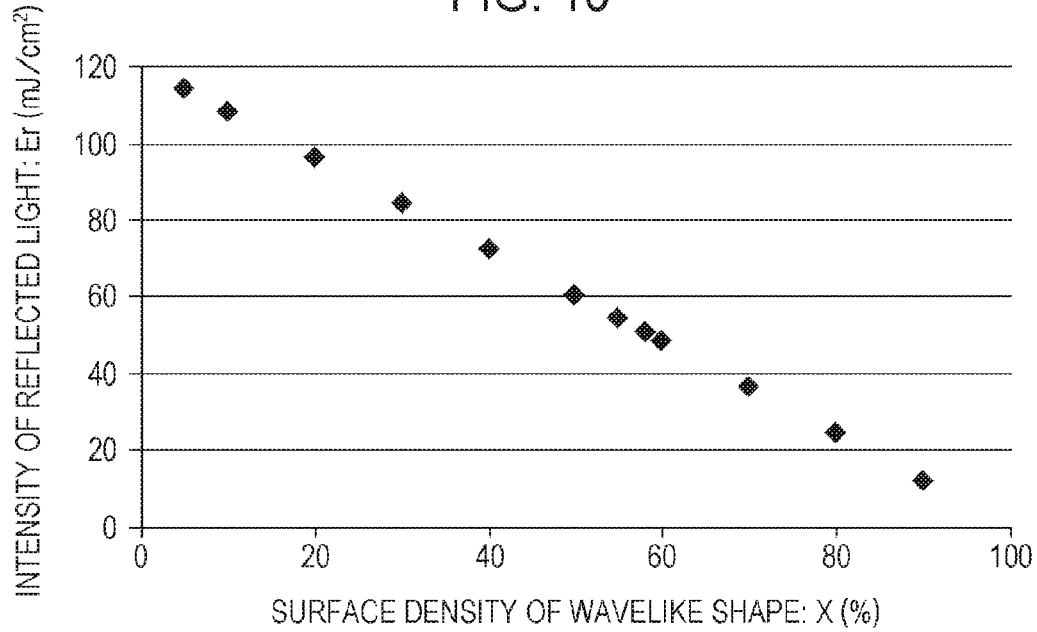
FIG. 10 is a view illustrating the relationship between the surface density of the wavelike shape and Er.

FIG. 10 shows the relationship between X and Er when φ is larger than or equal to 45°, i.e., a situation in which the lights hitting the wavelike shape are all scattered and do not return to the surface, is assumed. The incident light is set to satisfy Ei-400 mJ/cm².

In the system in which the spaces 5 are covered with the photosensitive resin layer 4, the threshold value of the reflected light intensity at which the fluctuation of the dimension due to the reflected light can be permitted is about 90 mJ/cm². As the cause why the threshold value is higher than the theoretical value, the presence or absence of the reflection from the base on which resin is formed is mentioned as one cause. In the situation shown in FIG. 6, the exposure is performed to the photosensitive resin layer formed on the silicon substrate and there is an effect caused by the reflection from the silicon substrate of the base. In contrast, in the case of a portion 21 which is exposed by the reflected light from the bottom surface of the space 5, a portion after the light passes through the resin layer is hollow and the base is not provided. Therefore, there is a possibility that the actual exposure doses in the former case and in the latter case are different from each other. Or, since both the surfaces of the resin layer contact a developing solution in development, there is also a possibility that the remaining film ratio decreases. Thus, in this case, it is supposed that the reflected light Er=50 mJ/cm² is an ideal range and Er=90 mJ/cm² is the actual threshold value to the incident light Ei=400 mJ/cm².

As the lower limit value of the area ratio X (%) in which the wavelike shape occupies the bottom surface of the space, the case where the efficiency of the wavelike shape is the maximum, i.e., φ is larger than or equal to 45°, is assumed. When Expression 5 is used, X=53.7% can be estimated to Er=50 mJ/cm², which is the ideal range, and X=16.7% can be estimated to Er=90 mJ/cm², which is the actual threshold value. In the case of φ<45°, the reflection suppression effect is compensated by correspondingly increasing the area ratio.

Next, the lower limit value of the side wall angle φ of the wavelike shape is estimated. When assuming the case where X=100% of the area ratio in which the wavelike shape occupies the bottom surface of the space can be realized, φ=31.2° can be estimated to Er=50 mJ/cm², which is the ideal range, and φ=16.8° can be estimated to Er=90 mJ/cm², which is the actual threshold value, from Expression 5. More specifically, the reflectivity Ir/Ii due to the wavelike shape of each case is equivalent to 13.9% and 25.0%, respectively, from Expression 4.

Therefore, the area ratio in which the wavelike shape occupies the bottom surface forming the space is preferably 16.7% and more preferably 53.7%. The side wall angle of the wavelike shape is preferably 16.8° or more and more preferably 31.2° or more. The reflectivity of the wavelike shape is preferably 25.0% or less and more preferably 13.9% or less.

Figure 11A:
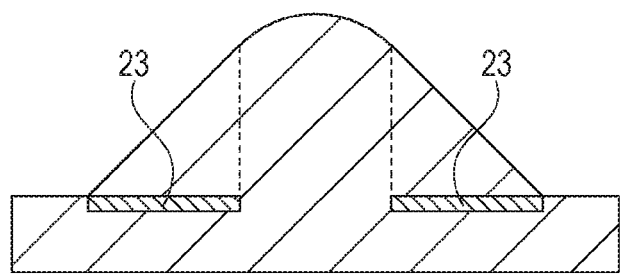
FIGS. 11A to 11C are views illustrating the wavelike shape.
Figure 11B:
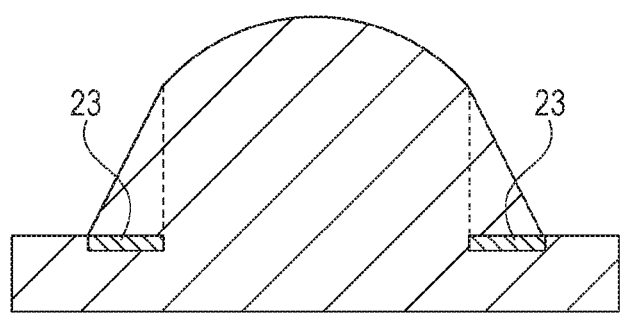
Figure 11C:
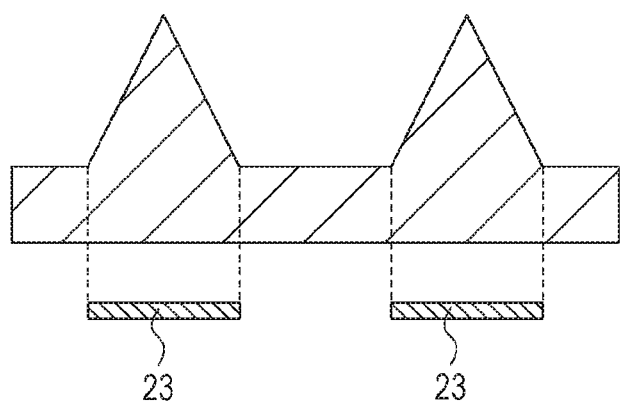

The area of the area ratio of the wavelike shape means the area in which the wall having the reflection suppression effect is projected on the bottom surface of the pattern. The wall having the reflection suppression effect is approximated to a side wall of 45° or larger. In other words, a region which inclines by an angle of 45° or more and less than 90° to the photosensitive resin layer of the wavelike shape is the reflection suppression region. In this case, the area ratio X refers to the ratio of an area 23 illustrated in FIG. 11A. The area ratio is a ratio of the area occupied by the reflection suppression region of the surfaces forming the space corresponding to the region to be exposed of the photosensitive resin layer when the photosensitive resin layer is viewed from the upper side. Even when the wavelike shape has the same bottom area as the structure, the area difference between the reflection suppression regions is large as is understood when FIGS. 11A and 11B are compared. Therefore, as the wavelike shape, it is suitable that structures having a closest-possible shape to a needle shape are arranged with a high density as illustrated in FIG. 11C. For example, cone-shaped or polygonal cone-shaped convex portions illustrated in FIG. 12A or concave portions, obtained by reversing the shapes of FIG. 12A, illustrated in FIG. 12B are suitable. In terms of manufacturing, the shapes illustrated in FIG. 12C or 12D in which the apex portions of the structures illustrated in FIG. 12A or 12B are removed to be round or flat or hemispherical shapes illustrated in FIG. 12E or 12F are suitable. The reflection suppression efficiency tends to correspondingly decrease but, in that case, the decrease can be compensated by increasing the pattern density. In the case of a hemisphere, for example, when assuming that only a portion in which the side wall angle exceeds 45° has the reflection suppression effect by simple calculation, the effective projected area having the reflection suppression effect is ¾ times the total projected area. Therefore, when the structures are arranged with a density by 4⁄3 times the density of the cone structures having the same bottom area, an almost equivalent reflection suppression effect is obtained.

The suppression of reflected light using such a wavelike shape demonstrates the effects when the space 5 is deeper. It is supposed that a dimension error affecting a pattern of an order of tens of micrometers to hundreds of micrometers is 10 μm. When an exposure system in which NA in Expression 2 is about 0.05 to about 0.1, i.e., θ is about 3° to about 6°, is assumed, the depth A at which an exposed portion L by reflected light exceeds 10 μm is about 100 μm. Therefore, when the depth of the space 5 exceeds 100 μm, the effects of the present invention are easily demonstrated. The depth of the space 5 is a height in a perpendicular direction to the photosensitive resin layer 4 of the space 5.

Next, a method employing two substrates and an intermediate layer is described as the method for manufacturing the structure of the present invention.

Figure 13A:
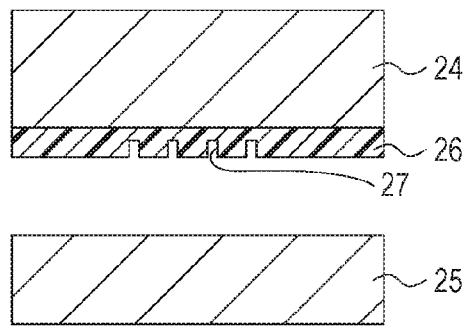
FIGS. 13A to 13H are views illustrating a method for manufacturing a structure.
Figure 13B:
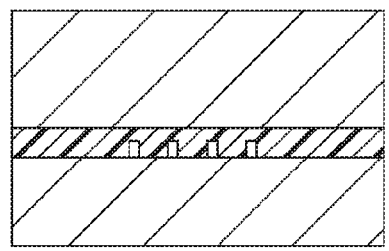
Figure 13C:
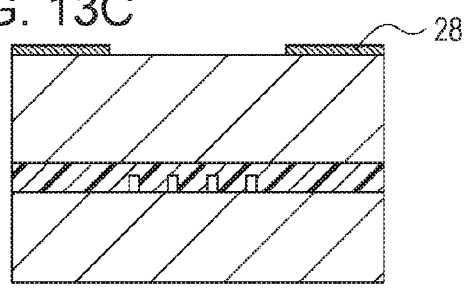

First, as illustrated in FIG. 13A, a first substrate 24 and a second substrate 25 are prepared, and then an intermediate layer 26 is disposed between the substrates 24 and 25. A wavelike shape 27 is formed in the intermediate layer 26. Then, the substrates and the intermediate layer are stuck to each other as illustrated in FIG. 13B. The first substrate 24 and the second substrate 25 are suitably formed with silicon. The intermediate layer 26 functions as a stopper for dry etching or the like and also functions as a mask for forming a wavelike shape which is a reflection suppression structure. Such an intermediate layer 26 is formed with resin (for example, photosensitive resin), silicon oxide, silicon nitride, silicon carbide, and metals other than silicon or metal oxides thereof or nitrides thereof, and the like. Among the above, it is suitable to use photosensitive resin or silicon oxide. As a method for sticking the substrates to each other, adhesion with a resin material, fusion bonding in which activated surfaces are brought into contact with each other, and then bonding spontaneously progresses, eutectic bonding, diffusion bonding, and the like are mentioned.

The thickness of the first substrate is preferably 100 μm or more and 800 μm or less. The thickness is more preferably 300 μm or more. The thickness is more preferably 600 μm or less. The thickness of the second substrate is preferably 50 μm or more and 800 μm or less. The thickness is more preferably 100 μm or more. The thickness is more preferably 200 μm or less.

Figure 13D:
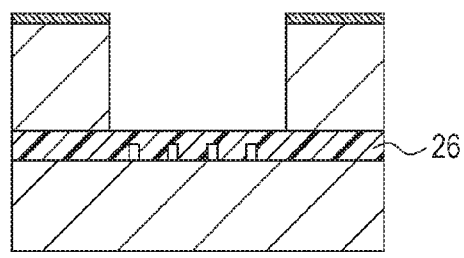
Figure 13E:
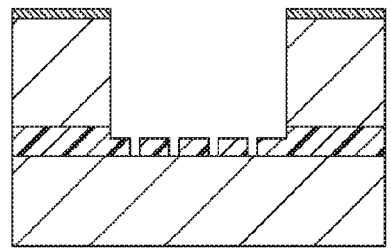
Figure 13F:
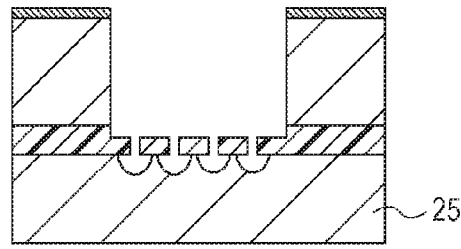
Figure 13G:
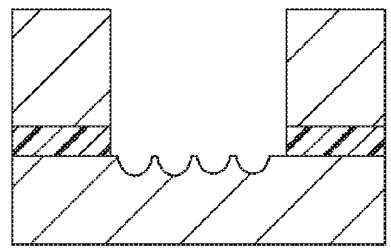

As illustrated in FIG. 13G, a mask 28 having an opening is disposed on a side opposite to the side on which the intermediate layer 26 is disposed of the first substrate 24. Then, as illustrated in FIG. 13D, etching is performed from the side on which the mask 28 is disposed. As the etching, dry etching and wet etching are mentioned, for example. In particular, etching by the bosch process is suitable. By the etching, the intermediate layer 26 is exposed to the etching surface.

Next, as illustrated in FIG. 13E, the exposed portion of the intermediate layer is partially removed. Thus, a mask having openings is formed from the intermediate layer 26. Then, using this mask, the second substrate 25 is etched as illustrated in FIG. 13F. By this etching, a surface in which a wavelike shape is formed as illustrated in FIG. 13G is formed. As the etching, dry etching and wet etching with high isotropy are mentioned. When the second substrate is a silicon substrate, dry etching using $SF_6$ and $XeF_2$ as the base, wet etching using an alkaline solution, and the like are suitable. The exposed portion of the intermediate layer may be entirely removed excluding the bonded position as illustrated in FIG. 13G.

Figure 13H:
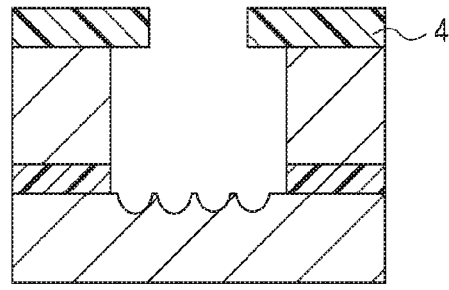

Finally, as illustrated in FIG. 13H, the photosensitive resin layer 4 is stuck, and then patterning is performed by photolithography. In the exposure, the reflection 4 from the space 5 to the photosensitive resin layer can be suppressed by the wavelike shape formed in the bottom surface of the space 5. When the method for manufacturing the structure is applied to a method for manufacturing a liquid election head, an energy-generating element and a channel forming member may be formed on a surface opposite to the surface on which the intermediate layer is disposed of the second substrate 25, for example.

As the method for manufacturing the structure of the present invention, a still another method is described.

Figure 14A:
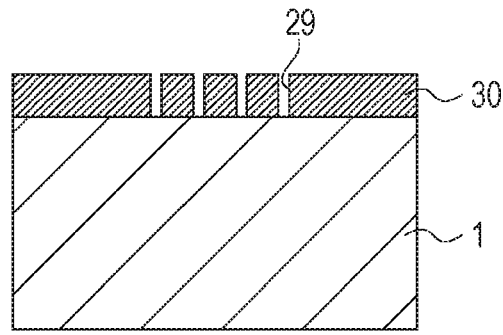
FIGS. 14A to 14C are views illustrating a method for manufacturing a structure.
Figure 14B:
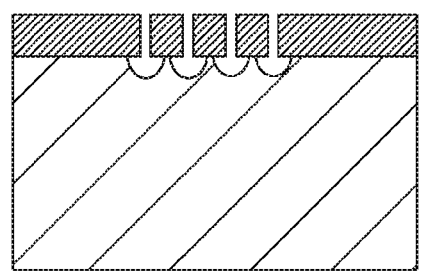

First, as illustrated in FIG. 14A, a substrate 1 and a mask 30 having first openings 29 on the substrate 1 are prepared. Then, as illustrated in FIG. 14B, the substrate 1 is etched by dry etching or the like through the mask 30 having the first openings 29.

Figure 14C:
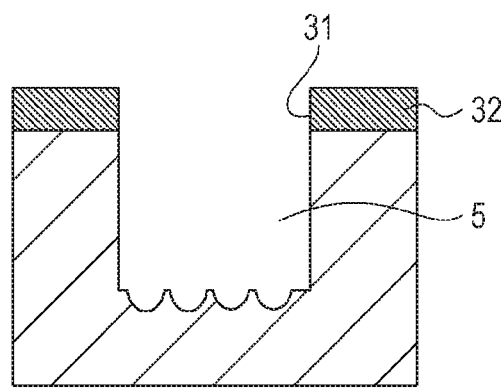

Next, as illustrated in FIG. 14C, the mask having the first openings 29 is removed and a mask 32 having second openings 31 which more widely open than the first openings is disposed on the substrate. Then, the substrate 1 is etched by dry etching or the like through the mask 32 having the second openings 31.

As a result, a wavelike shape is formed in the bottom surface of the space 5. The wavelike shape corresponds to the shape of the first openings 29. After that, a photosensitive resin layer is disposed in such a manner as to cover the space 5, and then is patterned by photolithography. In the exposure by photolithography, reflected light from the space 5 can be suppressed by the wavelike shape of the bottom surface of the space 5.

In the present invention, a wavelike shape is formed in a surface forming a space, and then a region including a surface facing the space of a photosensitive resin layer is exposed in the state where the wavelike shape is formed by the methods described above. Reflected light from the space can be suppressed by the wavelike shape. In a case where reflected light is demanded to be further suppressed, however, when the following method is carried out, the reflection suppression effect further increases due to the synergistic action with the wavelike shape.

Figure 15A:
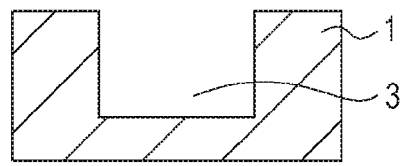
FIGS. 15A to 15F are views illustrating a method for manufacturing a structure.
Figure 15B:
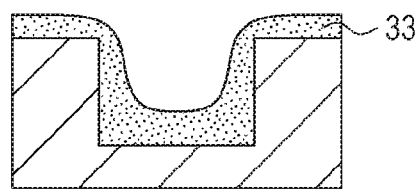

First, as illustrated in FIG. 15A, a concave portion 3 is formed in a substrate 1. The concave portion 3 is a region which serves as a space later and is formed by the methods described above.

Next, a resin layer 33 is applied in such a manner as to bury the concave portion 3. The resin layer 33 is a layer which absorbs exposed light of the photosensitive resin layer in a back-end process. Since the photosensitive resin layer is exposed using i-rays having a wavelength of 365 nm in some cases, a description is given using this example. In this case, the resin layer 33 is formed with one in which a light absorbent is added to resin. The absorbance of light having a wavelength of 365 nm of the resin layer 33 is 0.2 or more. As the resin, polymethyl isopropenyl ketone is mentioned, for example. In addition thereto, photodegradable-type high molecular weight compounds and the like typified by polymers of compounds containing a double bond can be used. In addition thereto, it is suitable to use vinyl ketone-based, such as polyvinyl ketone, or acryl-based polymers, and the like. As the light absorbent, it is suitable to use bisazide compounds, triazine-based compounds, and compounds having the following structure, i.e., polycyclic aromatic compounds.

[Chem. 1]

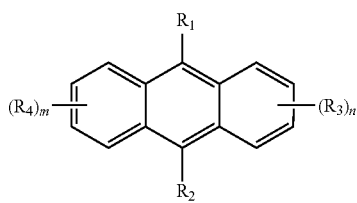

$R_1$, $R_2$, $R_3$, and $R_4$ each represent a hydrogen atom or a monovalent organic group and a and m represent integers of 0 or more and 4 or less.

For the formation of the resin layer 33, a method is suitable which includes adding dropwise resin onto a substrate, placing the substrate into a chamber in which the internal pressure is vacuum-depressurizaton controlled, and then applying and spreading the resin to the entire substrate. As a means for applying and spreading the resin, spin coating, slit coating, bar coating, and the like are mentioned. After the resin is applied and spread, a solvent is heated and dried. Thus, when the resin layer is formed under depressurization, remaining of air bubbles in the concave portion and the like can be prevented. It is suitable to perform the application and spreading in the atmosphere and perform the heating and drying after depressurized and dried. Or, also by performing a heating and drying process under depressurization, the remaining of air bubbles can be prevented. The resin layer is formed in such a manner as to be thicker in the concave portion and thinner in a convex portion (substrate surface) due to surface tension.

Figure 15C:
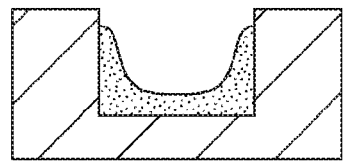

Next, as illustrated, in FIG. 15C, the resin layer 33 is patterned to leave the resin layer 33 in the concave portion 3. The patterning may be performed by photolithography or may be performed utilizing the film thickness difference between the thickness inside the concave portion and the thickness outside the concave portion by full-surface dry etching using oxygen plasma. More specifically, since the etching is completed in the resin layer having a small film thickness on the substrate earlier than the resin layer having a large film thickness in the concave portion, the resin layer can be left only in the concave portion. Moreover, since the inside of the concave portion is a narrow space, the dry etching rate is low, which makes it easier to leave the resin layer. Alternatively, full-surface exposure may be performed by photolithography not using a mask to leave the resin layer only in a cavity. More specifically, the exposure time and the resin reduction amount are controlled by the film thickness difference between the thickness inside the cavity and the thickness outside the cavity.

Figure 15D:
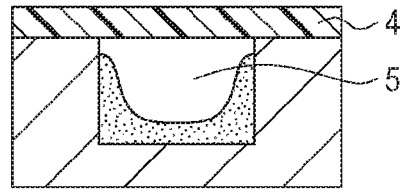

Next, as illustrated in FIG. 15D, a photosensitive resin layer 4 is provided in such a manner as to cover the concave portion. Thus, the concave portion 3 serves as a space 5.

Figure 15E:
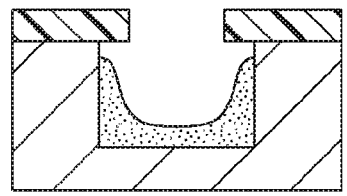

Next, as illustrated in FIG. 15E, the photosensitive resin layer 4 is exposed, developed, and patterned by photolithography. In the exposure, light is absorbed by not only the wavelike shape of the surface forming the space 5 but the resin layer 33, and thus reflected light can be prevented from reaching the photosensitive resin layer 4. In particular, when i-rays are used in the exposure, light having a wavelength of 365 nm has reflectivity to silicon of about 60% and is likely to cause diffused reflection from the space 5 but the reflection can be favorably suppressed by the resin layer 33.

Figure 15F:
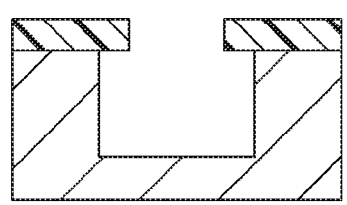

Finally, as illustrated in FIG. 15F, the resin layer 33 is removed to manufacture a structure on the substrate 1.

An example in which the method for manufacturing the structure is applied to a method for manufacturing a liquid ejection head is described with reference to FIGS. 16A to 16F.

Figure 16A:
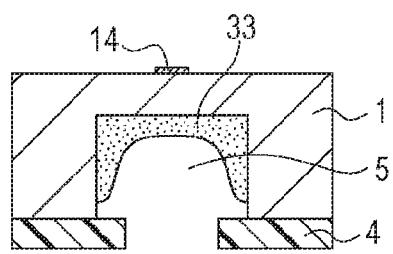
FIGS. 16A to 16F are views illustrating a method for manufacturing a liquid election head.

First, as illustrated in FIG. 16A, a resin layer 33 is disposed in a space 5 of a substrate 1, and processes to patterning by photolithography of the photosensitive resin layer 4 are performed. The processes so far are performed in the same manner as in the processes described with reference to FIGS. 15A to 15F. An energy-generating element 14 is disposed on the side opposite to the side on which the photosensitive resin layer 4 is disposed of the substrate 1.

Figure 16B:
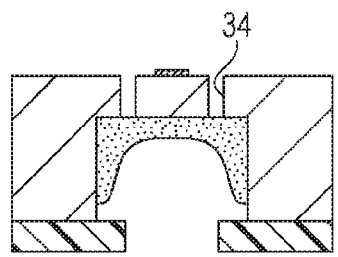

Next, as illustrated in FIG. 16B, dry etching or the like is performed from the surface opposite to the surface on which the energy-generating element 14 is disposed of the substrate 1 to form holes 34.

Figure 16C:
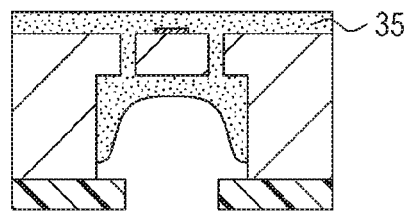
Figure 16D:
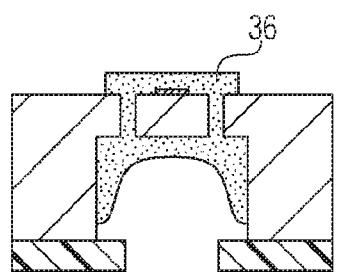

Next, the holes 34 are filled with a resin 35 as illustrated in FIG. 16C. The resin 35 is also applied onto the substrate 1. Then, as illustrated in FIG. 16D, the resin 35 on the substrate 1 is patterned by photolithography, dry etching, or the like. By the patterning, a mold material 36 of a channel is formed.

Figure 16E:
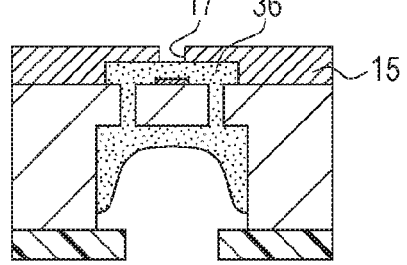

Next, as illustrated in FIG. 16E, a channel forming member 15 is formed in such a manner as to cover the mold material 36. In the channel forming member 15, an election port 17 is also formed.

Figure 16F:
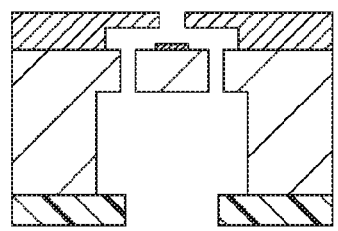

Finally, as illustrated in FIG. 16F, the resin layer 33 and the resin 35 are removed to manufacture a liquid ejection head. The resin layer 33 and the resin 35 are materials which can be simultaneously removed. The manufacturing efficiency of a liquid ejection head increases by simultaneously removing them.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-042690, filed Mar. 4, 2015 which is hereby incorporated by reference herein in its entirety.

What is claimed is:

1. A method for manufacturing a structure having a substrate in which holes are formed and a photosensitive resin layer provided on the substrate in such a manner as to cover at least a part of the holes, the method comprising:
preparing a substrate in which holes formed by a surface in which a wavelike shape is formed and a photosensitive resin layer provided on the substrate in such a manner as to cover at least a part of the holes; and
exposing the photosensitive resin layer on the substrate, wherein the wavelike shape of the surface forming the holes diffuses reflection in the holes during the exposing step causing light entering the hole to be absorbed and attenuated by the substrate.

2. The method for manufacturing a structure according to claim 1, wherein the substrate is a silicon substrate formed with silicon.

3. The method for manufacturing a structure according to claim 1, wherein the surface in which the wavelike shape is formed is formed by dry etching the substrate.

4. The method for manufacturing a structure according to claim 3, wherein the dry etching is a bosch process including repeating one cycle, which includes film formation of a protective film, etching of the protective film, and etching of the substrate, two or more times, and the surface forming the holes is formed by a final one cycle of the bosch process.

5. The method for manufacturing a structure according to claim 4, wherein the etching of the substrate is not performed in the final one cycle of the bosch process.

6. The method for manufacturing a structure according to claim 1, wherein the surface in which the wavelike shape is formed is a surface facing the photosensitive resin layer of the hole and including a bottom surface serving as a bottom of the hole.

7. The method for manufacturing a structure according to claim 1, wherein the surface in which the wavelike shape is formed includes a side surface connecting two surfaces facing the photosensitive resin layer.

8. The method for manufacturing a structure according to claim 1, wherein the surface in which the wavelike shape is formed has an arithmetic average roughness at a reference length of 50 µm of 0.02 µm or more and 0.50 µm or less.

9. The method for manufacturing a structure according to claim 1, wherein, when a region which inclines by an angle of 45° or more and less than 90° to the photosensitive resin layer of the wavelike shape is a reflection suppression region,
a region of 16.7% or more of the surface forming the hole corresponding to a region to be exposed of the photosensitive resin layer when the photosensitive resin layer is viewed from the upper side is the reflection suppression region.

10. The method for manufacturing a structure according to claim 9, wherein, when a region which inclines by an angle of 45° or more and less than 90° to the photosensitive resin layer of the wavelike shape is the reflection suppression region,
a region of 53.7% or more of the surface forming the hole corresponding to the region to be exposed of the photosensitive resin layer when the photosensitive resin layer is viewed from the upper side is the reflection suppression region.

11. The method for manufacturing a structure according to claim 1 comprising:
preparing a first substrate, a second substrate, and an intermediate layer having a wavelike shape disposed between the first substrate and the second substrate;
etching the first substrate from a side opposite to a side on which the intermediate layer is disposed to expose the intermediate layer;
removing a part of an exposed portion of the intermediate layer to form a mask having an opening from the intermediate layer; and
etching the second silicon substrate through the mask to form a surface in which the wavelike shape is formed.

12. The method for manufacturing a structure according to claim 1 comprising:
preparing a substrate and a mask having a first opening on the substrate;
etching the substrate through the mask having the first opening;
removing the mask having the first opening to form a mask having a second opening more widely opening than the first opening on the substrate; and
etching the substrate through the mask having the second substrate to form a surface in which the wavelike shape is formed.

13. The method for manufacturing a structure according to claim 1, wherein, when exposing a region including a surface facing the hole of the photosensitive resin layer, a resin layer absorbing light exposing the region is disposed in the hole.

14. The method for manufacturing a structure according to claim 13, wherein the resin layer disposed in the hole contains polymethyl isopropenyl ketone.

15. The method for manufacturing a structure according to claim 13, wherein the resin layer disposed in the hole contains a compound having a structure shown below

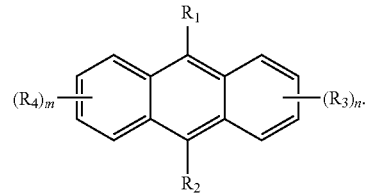

[Chem.1]

16. A method for manufacturing a liquid ejection head having a substrate in which holes are formed and a photosensitive resin layer provided on the substrate in such a manner as to cover at least a part of the holes, the method comprising:
preparing a substrate in which holes, formed by a surface in which a wavelike shape is formed, are formed and a photosensitive resin layer provided on the substrate in such a manner as to cover at least a part of the holes; and
exposing the photosensitive resin layer on the substrate.

17. The method for manufacturing a liquid ejection head according to claim 16, wherein a channel for liquid is formed in the photosensitive resin layer by exposing the photosensitive resin layer.

18. The method for manufacturing a liquid ejection head according to claim 16, wherein the surface in which the wavelike shape is formed is a surface formed by dry etching the substrate.

19. The method for manufacturing a liquid ejection head according to claim 18, wherein the dry etching is a bosch process including repeating one cycle, which includes film formation of a protective film, etching of the protective film, and etching of the substrate, two or more times, and the surface forming the hole is formed by a final one cycle of the bosch process.

* * * * *